United States Patent
Roza

(10) Patent No.: US 6,795,001 B2
(45) Date of Patent: Sep. 21, 2004

(54) ANALOG FIR-FILTER WITH Σ Δ MODULATOR AND DELAY LINE

(75) Inventor: Engel Roza, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/208,674

(22) Filed: Jul. 30, 2002

(65) Prior Publication Data

US 2003/0025624 A1 Feb. 6, 2003

(30) Foreign Application Priority Data

Aug. 3, 2001 (EP) .............................................. 01202954

(51) Int. Cl.[7] .............................. H03M 3/00; G06G 7/02
(52) U.S. Cl. ...................................... 341/143; 708/819
(58) Field of Search ................................. 341/143, 150, 341/61, 131, 118, 120; 375/229, 238, 371; 708/819, 319, 313; 455/307; 333/18; 327/552, 175; 330/126; 365/233; 369/59.2; 377/16

(56) References Cited

U.S. PATENT DOCUMENTS

| 4,467,287 | A | * | 8/1984 | Aylward ..................... 330/126 |
|---|---|---|---|---|
| 4,658,225 | A | | 4/1987 | Dukes et al. |
| 5,126,961 | A | * | 6/1992 | Garverick .................... 708/313 |
| 5,235,590 | A | * | 8/1993 | Taguchi et al. ............ 369/59.2 |
| 5,638,016 | A | * | 6/1997 | Eitrheim ..................... 327/175 |
| 5,831,465 | A | | 11/1998 | Watarai ....................... 327/281 |
| 5,995,030 | A | * | 11/1999 | Cabler ......................... 341/143 |
| 6,032,171 | A | | 2/2000 | Kiriaki et al. .............. 708/819 |
| 6,087,968 | A | * | 7/2000 | Roza ........................... 341/143 |
| 6,177,897 | B1 | * | 1/2001 | Williams ..................... 341/150 |
| 6,246,737 | B1 | * | 6/2001 | Kuglin ........................ 375/371 |
| 6,545,941 | B2 | * | 4/2003 | Kato et al. .................. 365/233 |
| 6,556,643 | B2 | * | 4/2003 | Merritt ........................ 377/16 |

OTHER PUBLICATIONS

Engel Roza, Member, IEEE "Analog–to–Digital Conversion via Duty–Cycle Modulation", IEEE Transactions on Circuits and Systems, vol. 44, No. 11, Nov. 1997, pp. 907–914.

* cited by examiner

*Primary Examiner*—Patrick Wamsley
(74) *Attorney, Agent, or Firm*—Michael J. Ure

(57) ABSTRACT

An analog FIR-filter comprising an asynchronous ΣΔ modulator (AM) generating amplitude-discrete time-continuous pulses coupled to a sequence of delay cells ($C_1$ ... $C_n$) for delaying the amplitude-discrete time-continuous pulses. One or more output devices ($O_1$, $O_n$, $S_1$, $S_n$, $I_1$, $I_n$) for low pass filtering of the delayed amplitude-discrete time-continuous pulses.

13 Claims, 7 Drawing Sheets

ANALOG FIR-FILTER WITH ΣΔ MODULATOR AND DELAY LINE

BACKGROUND OF THE INVENTION

This invention relates to an analog FIR (=finite impulse response) filter comprising an analog delay-line. FIR-filters, which are based on an analog delay-line, are useful in quite a number of applications. Very important is the application of such filters for general purpose spectral shaping and general purpose phase-linear filtering. Other applications are phase-linear pre-filtering and post-filtering to avoid aliasing in A/D and D/A conversion, in echo-producing and echo-canceling circuits etc. In these devices the delay-line usually has a plurality of taps from which the delayed signals are taken. In other devices the delay-line has only one output tap whereby the signals from the output tap and the input signals are combined, such as in the demodulation of PAL TV signals and in the implementation of comb filters to avoid cross-color distortion in PAL TV.

Originally analog delay-lines have been made by means of acoustic wave transmission in electromechanical devices. The invention of the bucket-brigade memory, later on generalized to charge-coupled-device (CCD) structures allowed the implementation of delay-lines in solid-state circuitry. However, this kind of analog delay-lines suffer from being prone to signal-deterioration, especially when the delay-line is long so that many signal transfers in the delay-line take place.

SUMMARY OF THE INVENTION

Today delay-lines are usually implemented by means of digital memories with A/D and D/A converters as I/O interfaces. However, the use of digital delay-lines could impose problems if relatively high bandwidths and high resolutions are required. Therefore it is an object of the invention to provide a FIR-filter comprising a delay-line which is able to handle the signals to be delayed in an analog fashion, and which does not suffer from the signal deterioration of prior art analog FIR-filters. The FIR-filter of the present invention is therefore characterized by an asynchronous ΣΔ modulator receiving an analog input signal and generating amplitude-discrete time-continuous pulses, a delay-line receiving said amplitude-discrete time-continuous pulses and comprising a sequence of delay cells for generating delayed amplitude-discrete time-continuous pulses at one or more outputs of the delay-line, and means connected to said one or more outputs for using the delayed amplitude-discrete time-continuous pulses to generate a filtered version of the analog input signal.

The asynchronous ΣΔ modulator accepts an analog input signal and produces a square wave, which has a time varying frequency and a time-varying duty-cycle. The duty-cycle is a linear function of the amplitude of the input signal, which implies that the analog input signal is preserved in the baseband part of the frequency spectrum of the square wave. Principle, construction and properties of the asynchronous ΣΔ modulator have been described in an article "Analog-to-Digital Conversion via Duty-Cycle Modulation", IEEE Transactions on Circuits and Systems, vol.44, no 11, November 1997, pp. 907–914.

The asynchronous ΣΔ modulator is followed by a delay-line for amplitude-discrete time-continuous pulses. This delay-line has to transfer merely a two-valued signal, so that the cells of the delay-line can be constructed by non-linear means. The signal content is preserved in the zero crossings of the signal and therefore, when the edges of the square wave are sufficiently steep, the signal to noise ratio can be maintained at a high level, even when the delay-line comprises a large amount of cells.

Subsequently, when a delayed version of the analog input signal is desired, the output of the last delay cell is followed by a low pass filter, which passes the base band. On the other hand, when an analog FIR-filter for other purposes is required, the delay-line is provided with a number of taps whose output square waves are each multiplied by a weighting factor and the weighted square waves are combined to constitute the filtered output signal of the filter.

It may be observed that the above referenced IEEE-article FIG. 3b shows an asynchronous ΣΔ modulator, which is followed by a sequence of delay cells for delaying the amplitude-discrete time-continuous pulses generated by the asynchronous ΣΔ modulator. However this arrangement is not included in a filter but in an AD-converter, wherein the output square waves of the delay-line are sampled with high frequency synchronous sampling pulses to constitute a synchronous 1-bit digital signal. In contradistinction, the arrangement of the present inventions seeks to constitute an analog filter with amplitude-discrete means, without the necessity of using high frequency sampling.

As stated above, the delay cells may be constructed by non-linear means. For instance, a chain of inverters could serve the purpose. However, because each inverter stage, when implemented in present day technology, has only a very small delay of a few picoseconds, a large number of inverters is usually needed to provide sufficient delay. Especially when relatively low frequency signals have to be filtered, long delay times are required so that a very large number of inverters is needed. This drawback may be overcome if, according to a further aspect of the invention, the analog FIR-filter is characterized in that each of the delay cells comprises means for generating a one-shot pulse with a leading edge and a trailing edge, wherein the leading edge of a cell in the sequence is started by the trailing edge of the one-shot pulse generated in the previous cell in the sequence.

Preferably the analog FIR-filter of the invention may be further characterized in that each of the delay cells comprises means for generating spikes at the trailing edge of said one-shot pulse and means to apply said spikes to the next cell in the sequence of cells and/or to a latch for generating delayed amplitude-discrete time-continuous pulses. This implementation of the delay cell allows a more accurate delay as compared with a delay cell that receives and generates full amplitude-discrete time-continuous pulses. When a spike of the previous cell arrives, a capacitance is discharged and the one-shot pulse starts. Subsequently the capacitance is charged by a DC bias current and at a certain moment, when the voltage across the capacitance reaches a threshold value, the one-shot pulse ends. In this arrangement, the duration of the one-shot pulse, which constitutes the delay of the cell, may be easily set by properly choosing the values of the capacitance and of the DC bias current. Moreover the delay may be easily controlled, if desired, by controlling the magnitude of the bias current.

There are basically two design parameters of the FIR-filter of the present invention. The first parameter is the center frequency of the asynchronous ΣΔ modulator, i.e. the frequency of the square wave delivered by the asynchronous ΣΔ modulator when its input signal is zero. To safeguard a low aliasing distortion in the modulator, this center frequency should be high enough, e.g. higher than three times the baseband bandwidth of the input signal. The second parameter is the setting of the width of the one-shot pulses in the delay cells. This pulse-width should be just smaller than the smallest pulse-width that can occur in the square wave of the asynchronous ΣΔ modulator, in order to avoid that the one-shot pulses overlap the edges of the square wave to be delayed. A calculation reveals that the width of the one-shot pulses may not be larger than one quarter of the period of the center frequency. This of course limits the delay, which can be obtained per cell. An improvement of this figure can be obtained when the analog FIR-filter of the present invention is characterized by two delay-lines, one for delaying the leading edges of the amplitude-discrete time-continuous pulses generated by the asynchronous ΣΔ modulator and one for delaying the trailing edges of the amplitude-discrete time-continuous pulses generated by the asynchronous ΣΔ modulator and latch means for combining the output signals of the two delay-lines to generate delayed amplitude-discrete time-continuous pulses. In this arrangement the maximum delay per cell is equal to the full period of the center frequency of the asynchronous ΣΔ modulator.

It appears that the one-shot pulse-width is more critical to the filter accuracy than the value of the center frequency. The center frequency should merely be high enough to prevent a serious amount of aliasing and low enough to prevent overlap with the one-shot pulses in the delay cells. In contradistinction, the width of the one-shot pulses is more critical to the characteristics of the filter because this pulse-width determines the amount of delay. Therefore it is a further object of the present invention to provide an analog FIR-filter which is characterized by a dummy one-shot pulse generator that is matched to the one-shot pulse generating means of the sequence of delay cells, by means to initialize the dummy one-shot pulse generator with a fixed duty-cycle reference frequency, by means to compare the one-shot pulse of the dummy one-shot pulse generator with the reference frequency and by means to apply the result of the comparison to the dummy one-shot pulse generator and to the one-shot pulse generating means of the sequence of delay cells, to control the pulse-width thereof. In this way the width of the one-shot pulses can be set accurately despite the unavoidable spread caused by product tolerances.

It may seem that the above-described two-delay-line concept has a problem when there is non-uniformity between the one-shot pulse generators of one of the delay-lines and the one-shot pulse generators of the other delay-line. If there is non-uniformity, the delay in one of the delay-lines is different from the delay in the other delay-line, so that the duty cycle of the waveform may change along the lines. However, this is less harmful then might be expected, provided this non-uniformity is of static nature. Then the output of the FIR-filter merely shows a DC-offset error.

When this DC-offset is acceptable, a simpler implementation of the delay cells may be applied when, according to a further aspect of the invention, the delay cells each comprise a low-current inverter receiving the amplitude-discrete time-continuous pulses to be delayed and generating pulses with relatively low-steep slopes and one or more high-current inverters receiving said low-steep slope pulses and generating delayed amplitude-discrete time-continuous pulses with relatively high-steep edges. In this case, instead of the delay of spikes, the full, unmodified, amplitude-discrete time-continuous pulse train is passed through the delay-line. In this case the delay-cell may only consist of a few inverters, while the charging and discharging of the parasitic capacitance between the low-current inverter and the first high-current inverter obtain the delay. Although in this implementation, the delay per cell is smaller than in the former described implementations, so that a larger amount of cells is required, this disadvantage may be counterbalanced by the smaller chip-area that is needed per cell. Also with this implementation of the delay cells it is of importance to make the cell-delay independent of the production-spreads and therefore this implementation of the analog FIR-filter of the present invention may be further characterized by one or more dummy delay-cells which are matched to the cells of the sequence of delay cells and which are arranged in a feedback arrangement to constitute an oscillatory circuit, by means to compare the pulses generated by the oscillatory circuit with a reference frequency and by means to apply the result of the comparison to the dummy delay cells and to the delay cells of the sequence of delay cells, to control the delay thereof.

BRIEF DESCRIPTION OF THE DRAWINGS

The invention will be further explained with reference to the attached drawing, which shows.

DESCRIPTION OF THE PREFERRED EMBODIMENTS

Figure 1:
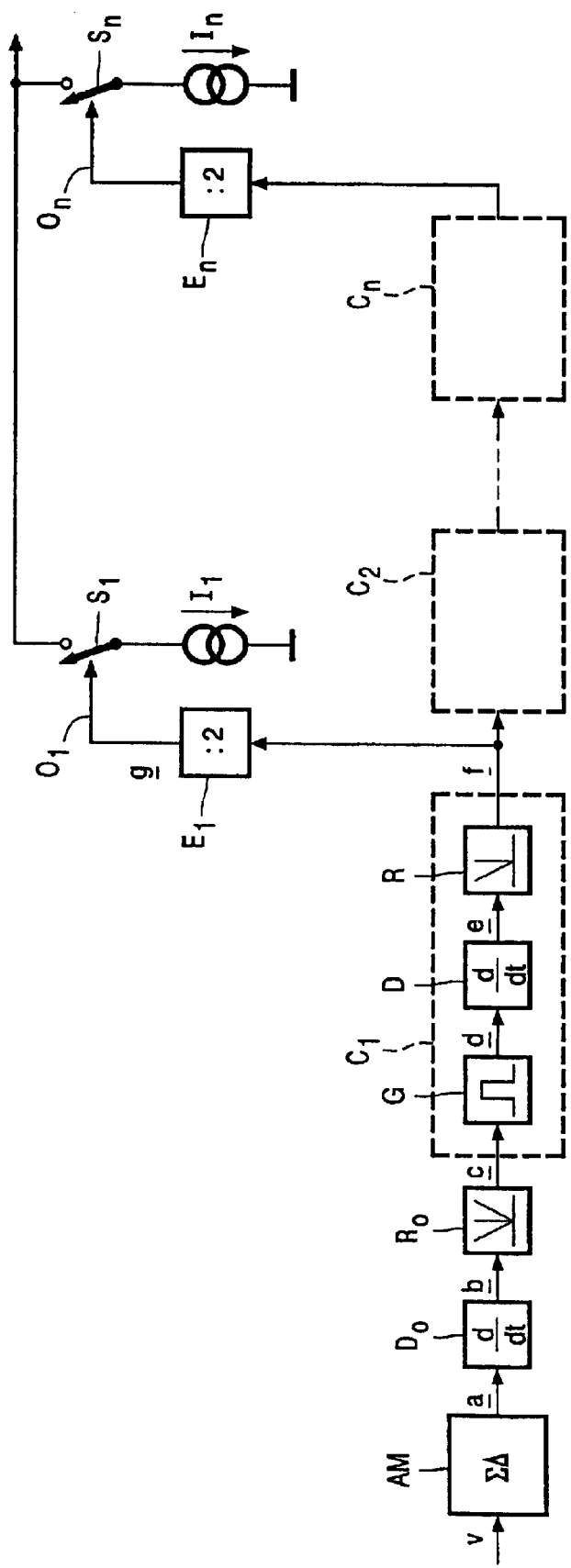
FIG. 1 a first embodiment of an analog FIR-filter according to the invention.

The analog FIR-filter of FIG. 1 comprises an asynchronous ΣΔ modulator AM that receives an analog input signal v. The output signal of the asynchronous ΣΔ modulator is a square wave a whose time-continuous edge-positions vary with the input signal. The asynchronous ΣΔ modulator closely approximates an ideal duty-cycle modulator, which is characterized by a linear relationship between the input signal v and the duty-cycle τ/T of the square wave. The instantaneous frequency f=1/T of the square wave is quadratically dependent on the input signal v. The operation of the asynchronous ΣΔ modulator can be described by the following set of equations:

$$\frac{\tau}{T} = \frac{v+1}{2} \text{ and } \frac{f}{f_c} = 1 - v^2 \text{ with } |v| < 1.$$

Herein, $f_c$ the center frequency of the asynchronous ΣΔ modulator. That is the frequency of the square wave when the input signal v is zero and which is dependent on the dimensioning of the feedback loop inside the modulator.

The square wave a of the asynchronous ΣΔ modulator is differentiated in a differentiator $D_0$. This differentiator provides positive and negative spikes b at respectively the leading (=up going) and trailing edges (=down going) edges of the square wave a. These spikes are rectified in a full wave rectifier $R_0$ which provides positive spikes c at both the leading and the trailing edges of the square wave a. The spikes c are applied to a first delay cell $C_1$ of a sequence of identical delay cells (=delay-line) $C_1 \ldots C_n$. Each delay cell comprises a one-shot generator G that is followed by a differentiator D and a half wave rectifier R. Upon the occurrence of a spike c the one-shot generator G starts generating a single (one-shot) pulse d with a pulse-width $T_s$. This pulse-width is a design parameter of the one-shot generator G. The one-shot pulses d are differentiated in the differentiator D to generate positive and negative spikes e caused by respectively the leading and trailing edges of the one-shot pulses. A half wave rectifier R blocks the positive spikes and passes (and inverts) the negative spikes, so that a sequence of positive spikes f, which coincide with the trailing edges of the one-shot pulses d, is obtained.

Figure 2:
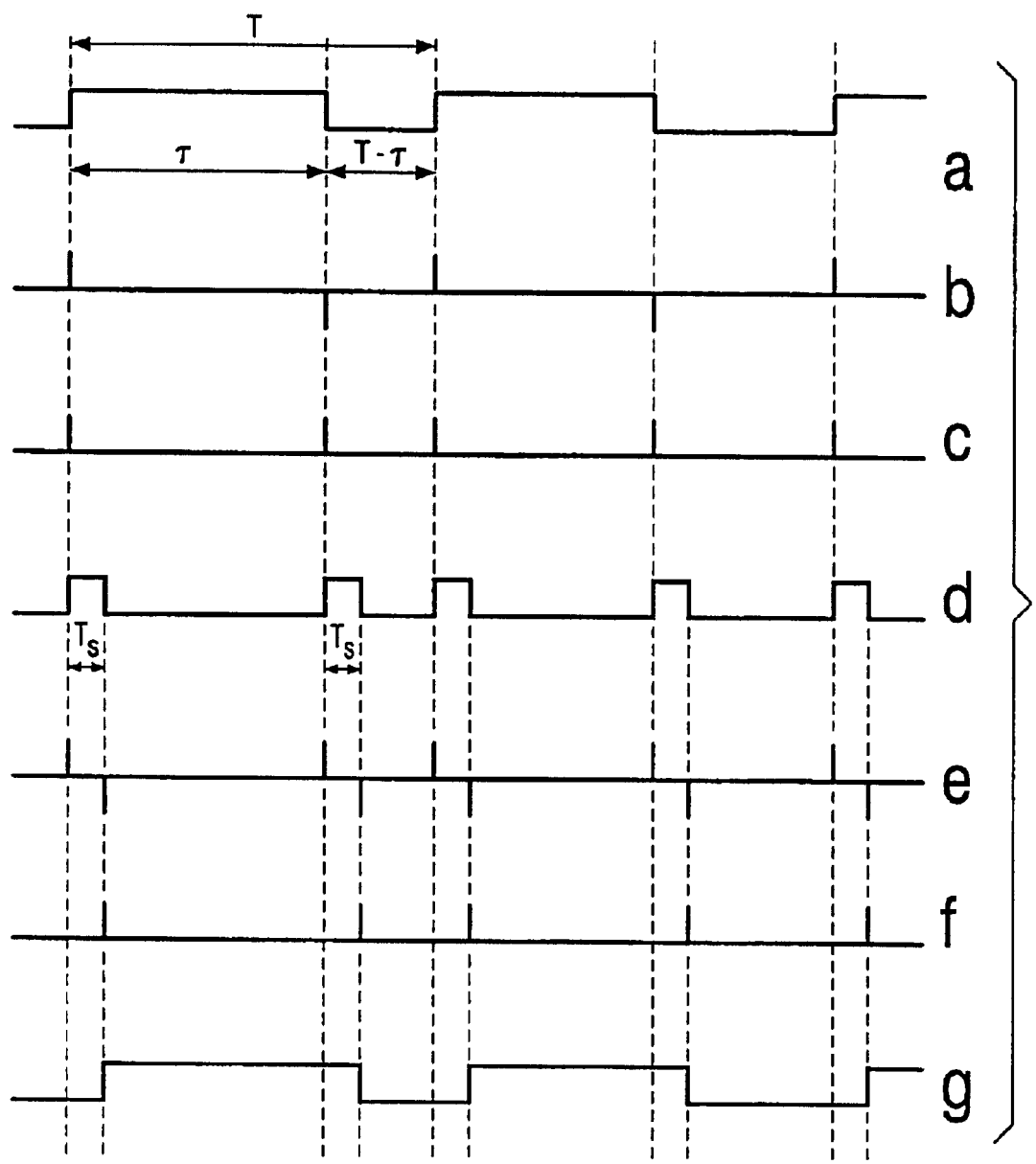
FIG. 2 waveforms for explaining the operation of the embodiment of FIG. 1.

FIG. 2 represents the signals a to f. From this figure it can be seen that the sequence of spikes f is identical to the sequence of spikes c except in that the spikes f are delayed with respect to the spikes c by a time-period which is equal to the width $T_s$ of the one-shot pulses. The delayed spikes f are applied to the next delay cell $C_2$ of the delay-line.

A "divider by 2" latch $E_1$ receives the spikes f and generates from these spikes a square wave g which is identical to the original square wave a except in that the square wave g is delayed by the delay period $T_s$. The output of the "divider by 2" latch $E_1$ constitutes an output tap $O_1$ of the delay-line. FIG. 1 shows a corresponding unit $E_n$ that constitutes a second output-tap $O_n$ of the delay-line. It may be observed that the number of output taps may be substantially less than the number of delay cells. The number of delay cells (n) is determined by the total amount of delay required and the amount of delay that can be accomplished by one individual cell. On the other hand, the number of output taps is given by the required order of the filter. When it is desired to merely delay the input signal v over a certain period, e.g. in case of a PAL delay-line, the number of delay cells will be very large and only the last cell will have an output tap $O_n$, which is then followed by a low pass filter to regain the (delayed) baseband signal.

From the above it may be clear that the delay cells of FIG. 1 receive and delay only signals (spikes) that are indicative of the edges of the amplitude-discrete time-continuous pulses and these spikes are only restored into complete amplitude-discrete time-continuous pulses when necessary i.e. at the output taps $O_1$, $O_n$.

Usually, when a transversal analog FIR-filter is required, the signals at the output taps have to be multiplied with a weighting factor and the so weighted signals are added to constitute the output signal of the filter. This function then needs an analog multiplier for each of the output signals. Because of the amplitude-discrete nature of the signals to be weighted, this functionality is in the arrangement of the invention more easily performed by switches $S_1$, $S_n$ which are switched by the output signals of the latches $E_1$, $E_n$ and which switch the weighting current from weighting current sources $J_1$, $J_n$. The switched weighting currents are added together to obtain the filtered output signal. Because the duty-cycle of the time-continuous pulses obtained from the units E is linearly dependent on the (delayed) input signal v, each of the switched weighting currents constitute an analog multiplication of the delayed input signal v and the weighting current.

Figure 3:
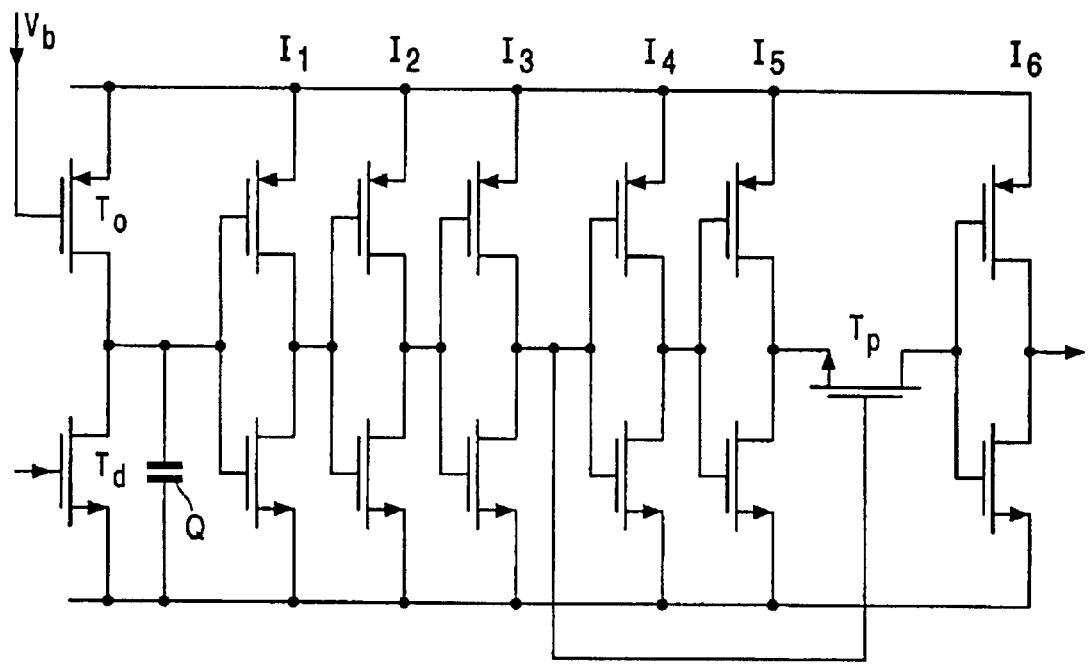
FIG. 3 a first transistor implementation of a delay cell for use in an analog FIR-filter according to the invention, FIG. 4 a second embodiment of an analog FIR-filter according to the invention, FIG. 5 waveforms for explaining the operation of the embodiment of FIG. 4, FIG. 6 an implementation of a delay control circuit for use in an analog FIR-filter according to the invention, FIG. 7 a second transistor implementation of a delay cell for use in an analog FIR-filter according to the invention and FIG. 8 a third embodiment of an analog FIR-filter according to the invention and a delay control circuit therefor.

FIG. 3 shows a transistor diagram of a delay cell of the arrangement of FIG. 1. The one-shot generator comprises a capacitor Q, a bias transistor $T_b$, a discharge transistor $T_d$ and a hard limiter of three inverter stages $I_1$, $I_2$ and $I_3$. A spike from the previous cell discharges the capacitor through the transistor $T_d$ and forces its voltage to be low, which starts the one-shot pulse at the output of the inverter $I_3$. Subsequently the current through the bias transistor $T_b$ charges the capacitor and at a certain moment in time the threshold value of the hard-limiter is reached and the one-shot pulse ends, while the charging of the capacitor continues. The sequence is repeated when a new spike arrives at the input of the delay cell. The cascade of three inverter stages $I_1$, $I_2$ and $I_3$ ensures that the edges of the one-shot pulse are sufficiently sharp. This can also be done by a positive feedback in the one-shot generator so as to constitute a monostable flip-flop, but this is more difficult to implement on chip.

Three further inverters $I_4$, $I_5$ and $I_6$ and a pass transistor $T_p$ between the inverters $I_5$ and $I_6$ implement the differentiator/rectifier of the cell. The pass transistor is fed by the square wave at the output of inverter $I_3$ and the, by two inverter stages $I_4$ and $I_5$ delayed, square wave at the output of inverter $I_5$. The difference between the two square waves is a spike that is inverted by $I_6$.

The width $T_s$ of the one-shot pulse (see FIG. 2 curve d) may not overlap the next edge of the square wave of curve a. With other words: the pulse-width $T_s$ should not be larger then the smallest of the periods τ and T−τ of the square wave to be delayed. From the earlier given formulas it can easily be derived that this leads to the requirement that, if the full modulation depth of the asynchronous ΣΔ modulator has to be used, the one-shot pulse should not be broader than a quarter of the period $T_c$ of the center frequency. In practice this requirement severely limits the delay per cell, so that a large number of cells has to be applied.

Figure 4:
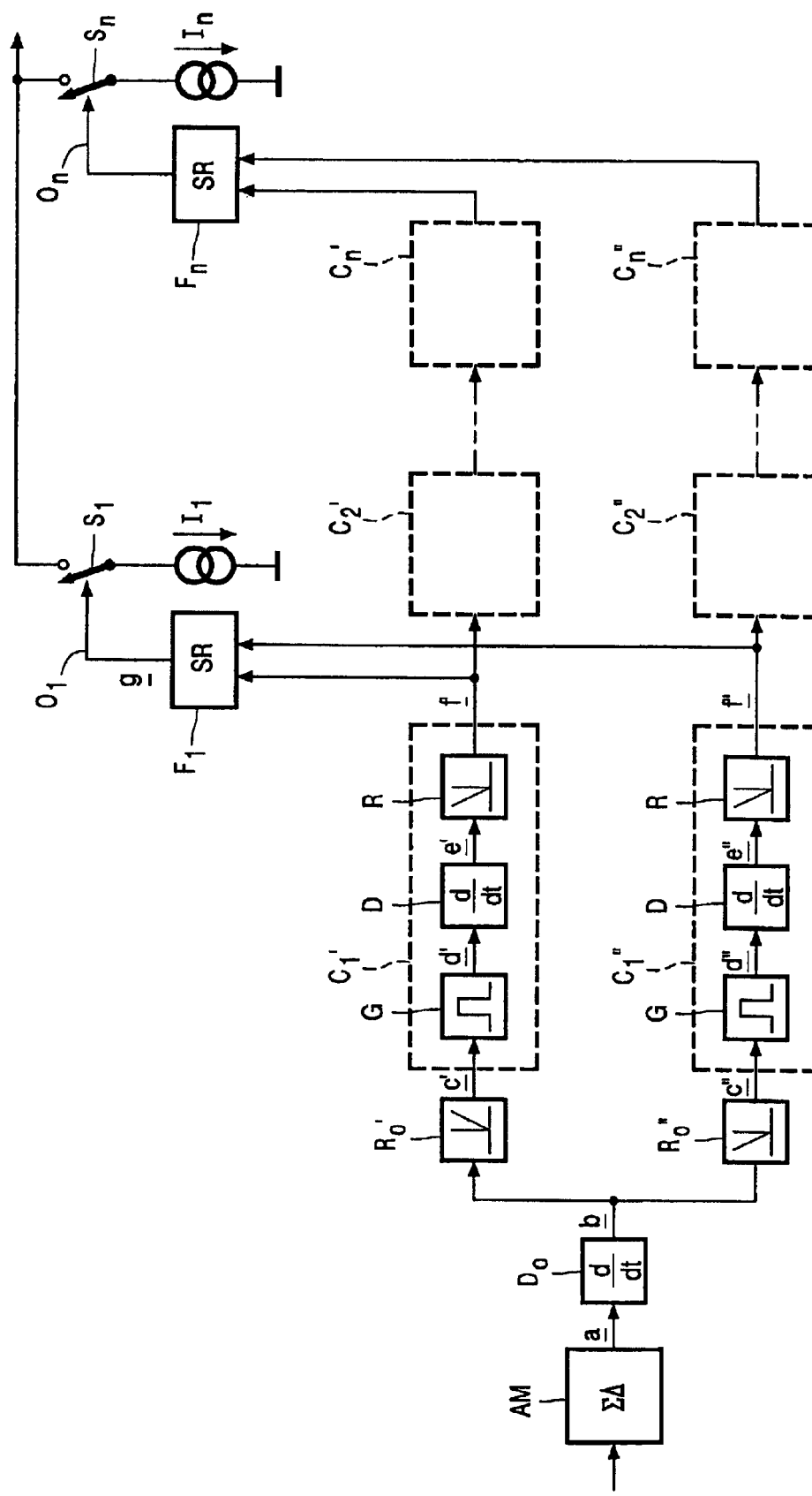
Figure 5:
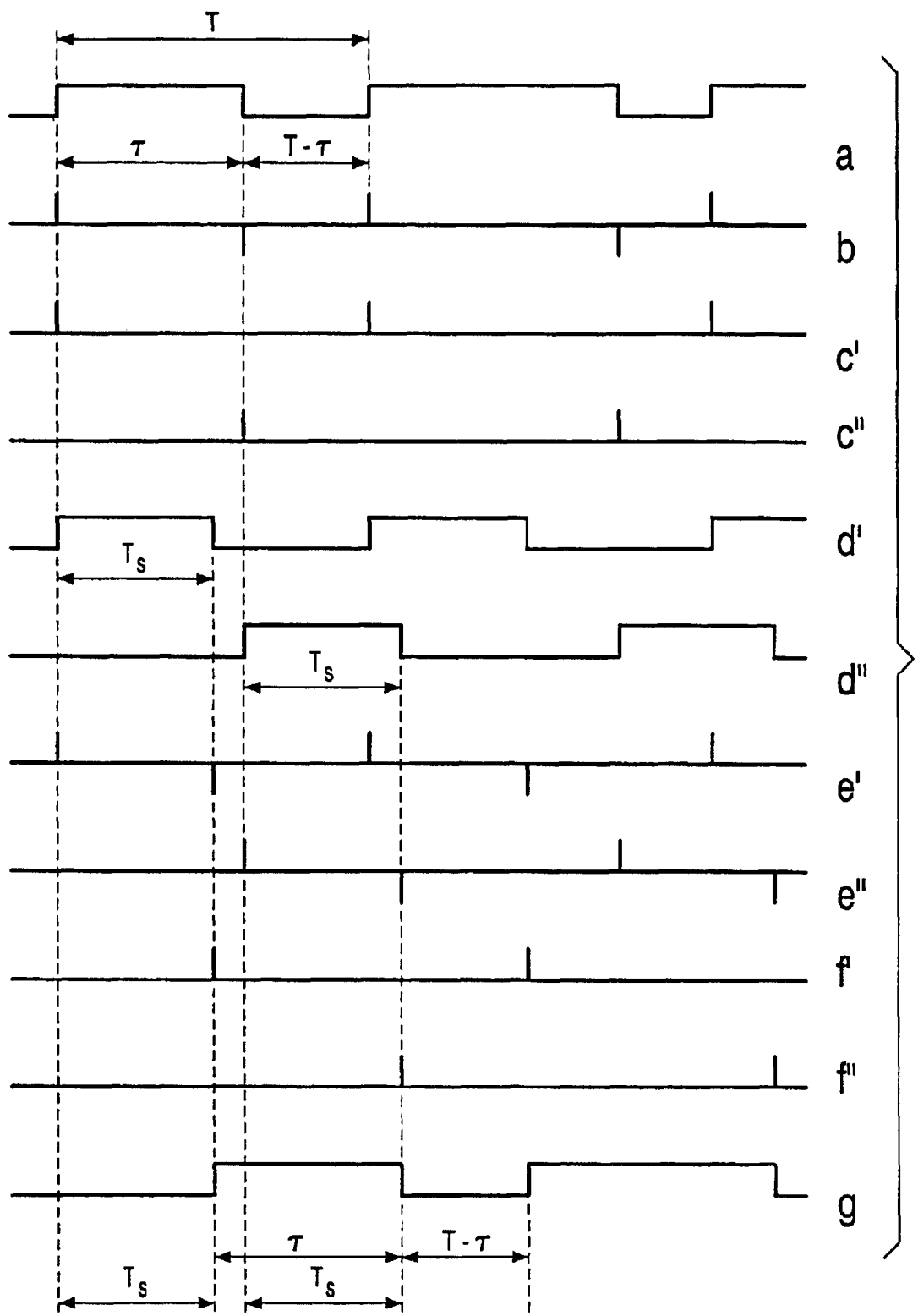

An improvement in this respect is shown in FIG. 4. Instead of a single delay-line, two delay-lines $C_1' \ldots C_n'$ and $C_1'' \ldots C_n''$ in parallel are used. The full wave rectifier $R_0$ of FIG. 1 is replaced by two half wave rectifiers $R_0'$ and $R_0''$, so that one of the delay-lines is driven by the positive spikes of waveform b and the other by the negative spikes of this waveform. The waveforms a, b, c', c'', d', d'', e', e'', f, f'' and g that appear in this arrangement, are shown in FIG. 5. It is now possible to increase the one-shot pulse-width by a factor 4 to a full period $T_c$ of the center frequency, thereby considerably alleviating the high frequency capabilities of the analog FIR-filter of the invention. At the output-tap positions an integrate-and-dump operation replaces the divider-by-2 operation of FIG. 1. Set-reset latches $F_1$, $F_n$ can readily implement this operation. If the one-shot generators G of the two branches are not uniform, the delay in the upper branch is different from the delay in the lower branch. Therefore the duty-cycle of the waveform as represented by g may change along the line. This is less harmful than one might expect, provided that the non-uniformity is of static nature. Then the output of the filter shows a DC offset error as a consequence of the different static contributions of the delayed samples that constitute the filter output.

Figure 6:
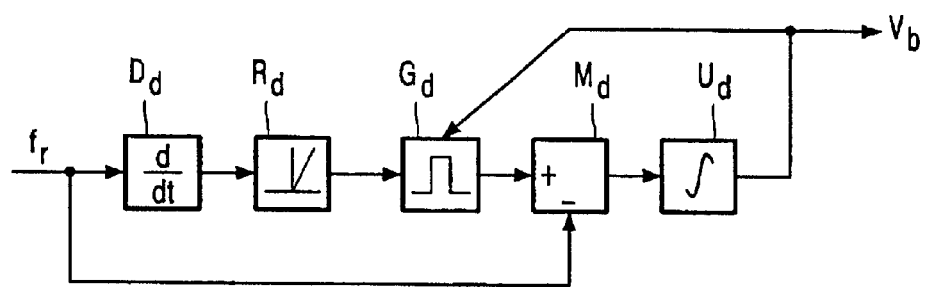

FIG. 6 shows an implementation of a one-shot pulse-width control unit. The unit is driven by a fixed duty-cycle reference frequency $f_r$. Preferably a frequency of $2*f_r$ is divided by 2 so that a reference square wave of frequency $f_r$ with exact 50% duty-cycle is obtained. This square wave is differentiated en rectified in a differentiator $D_d$ and a half wave rectifier $R_d$ so as to provide unipolar spikes. These spikes start a dummy one-shot pulse generator $G_d$ that is a close copy of the one-shot pulse generators G of the delay-line cells. In a subtracter $M_d$ the one-shot pulses of the dummy generator $G_d$ and the 50% duty-cycle pulses of the reference waveform are compared. Any difference between the two pulses is integrated in an integrator $U_d$ to obtain a control voltage $V_b$. This control voltage is fed back to the dummy one-shot pulse generator $G_d$ to automatically adjust the one-shot pulse-width $T_s$ to the pulse-width of the reference waveform. The control voltage $V_b$ is also fed to the one-shot pulse generators G of the delay cells (e.g. to the gate of the bias transistor $T_b$ in FIG. 3) in order to adjust all the one-shot pulses to that of the reference waveform.

Figure 7:
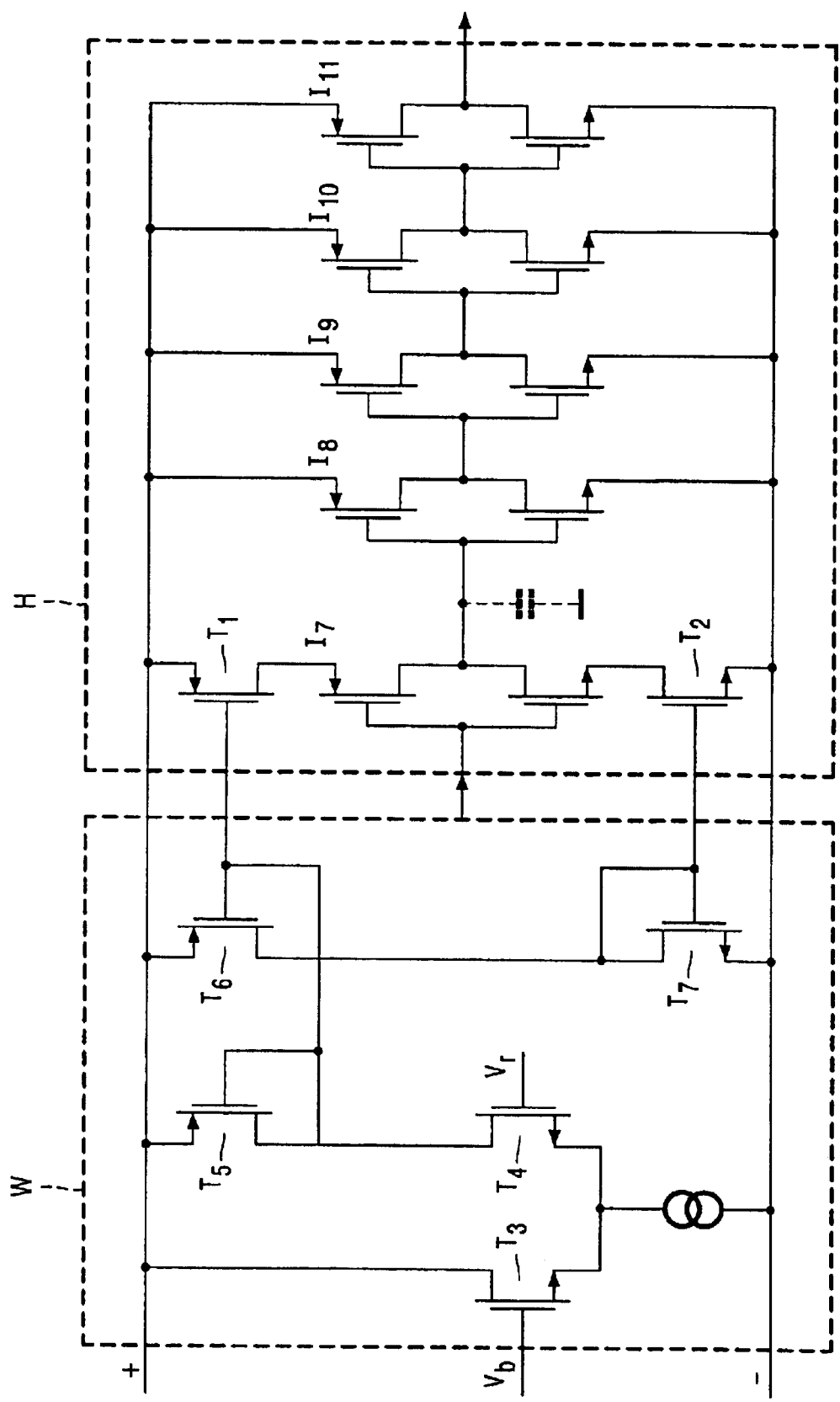

In FIG. 7 the box with reference H shows a different type of delay cell. In contradistinction to the delay cell described in FIG. 3 that receives and delays spikes representing the edges of the amplitude-discrete time-continuous pulses, the delay cell H of FIG. 7 receives and delays the full amplitude-discrete time-continuous pulses. The delay cell H comprises five inverters $I_7 \ldots I_{11}$ of which the first inverter $I_7$ carries a low current and the four other inverters $I_8 \ldots I_{11}$ carry a high current. The current of the inverter $I_7$ is limited by two transistors $T_1$ and $T_2$ which are connected in series with the inverter $I_7$ and which are controlled by a control unit W. Upon the occurrence of a rising flank of the pulse applied to the input of the inverter $I_7$, the parasitic capacitance at the output of this inverter is slowly discharged through the lower transistor of this inverter and through the transistor $T_2$. Equally, upon the occurrence of a falling flank of the input pulse, the parasitic capacitance is slowly charged through the transistor $T_1$ and the upper transistor of the inverter $I_7$. Consequently the edges of the pulse-train at the output of the inverter $I_7$ have low steepness. The inverters $I_8 \ldots I_{11}$ serve to regenerate steep edges at the instant when the slopes of the output-pulses of the inverter $I_7$ pass the level substantially halfway between the positive and negative supply voltages of the delay cell, so that the delay delivered by the delay cell is about half the duration of the slope.

The control unit W comprises a differential transistor pair $T_3$, $T_4$ with their source-electrodes connected to a common current source, with the gate electrode of transistor $T_3$ connected to a control voltage $V_b$ and with the gate electrode of transistor $T_4$ connected to a reference voltage $V_r$. The drain electrode of transistor $T_4$ is connected to a transistor $T_5$ that forms, through a connection $V_1$, a current mirror with the transistor $T_1$ in the delay cell H and a second current mirror with a transistor $T_6$. This latter transistor $T_6$ supplies its current to a transistor $T_7$ that forms, through a connection $V_2$, a current source with transistor $T_2$ in the delay cell. With this arrangement it is assured that the drain current of transistor $T_4$, which is controlled by the control voltage $V_b$, is mirrored through the transistors $T_5$ an $T_1$ to the upper transistor of the inverter $I_7$ and is also mirrored through the transistors $T_5$, $T_6$, $T_7$ and $T_2$ to the lower transistor of the inverter $I_7$. Therefore, by changing the control voltage $V_b$ at the input of the control unit W the current through the inverter $I_7$ and consequently the slope of the pulse edges and therefore the delay of the delay cell is controlled.

Figure 8:
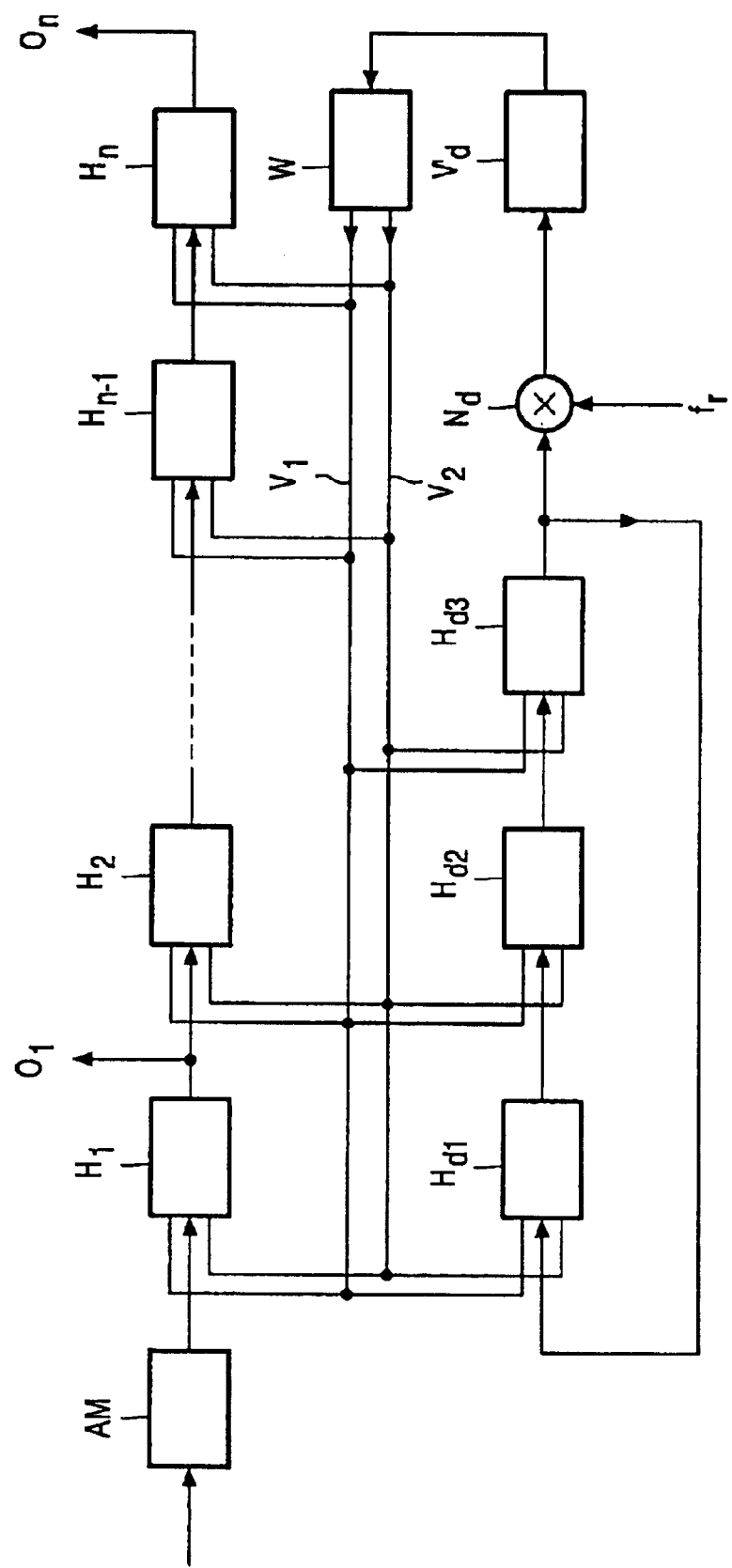

FIG. 8 shows a FIR-filter arrangement, which comprises a cascade of delay cells $H_1 \ldots H_n$, each of which is identical to the delay cell H of FIG. 7. It may be observed that the cascade of delay cells is fed directly by the asynchronous $\Sigma\Delta$ modulator AM, i.e. without a differentiator and rectifier being interconnected. It may also be noted, that the delayed amplitude-discrete time-continuous pulses can be directly taken from taps $O_1$, $O_n$ of the delay-line, i.e. without latches or set-reset units being required. These output taps may be connected to switches $S_1$, $S_n$ as is shown in FIGS. 1 and 4.

In order to control the delay of the delay-line $H_1 \ldots H_n$, the arrangement of FIG. 8 comprises three dummy delay cells $H_{d1}$, $H_{d2}$, $H_{d3}$, which are identical to the cells of the delay-line $H_1 \ldots H_n$. The output of the cell $H_{d3}$ is fed back to the input of cell $H_{d1}$, so that an oscillatory circuit is constituted. This circuit oscillates at a frequency at which the input and output signals are in phase. With an odd number of delay cells (3) and an odd number (5) of inverters per cell, the total delay of the three delay cells has to make a phase shift of 180°. This means that each cell has a delay of 60° or ⅙ the period of the oscillating frequency. The output waveform of the oscillatory circuit is compared with a stable reference frequency $f_{ref}$ in a multiplier $N_d$ and the result of this comparison constitutes, after integration in an integrator $U_d'$ the control voltage $V_b$ for application to the control circuit W. The control circuit W serves to control, through the connections $V_1$ and $V_2$, the delay of all the delay-cells $H_1 \ldots H_n$ of the delay-line and of the three dummy delay cells $H_{d1}$, $H_{d2}$ $H_{d3}$. The phase locked loop, consisting of the oscillatory circuit, the multiplier $N_d$, the integrator $U_d'$ and the control circuit W, controls the delay of the three dummy delay cells so that the frequency of the oscillatory circuit equals the reference frequency $f_{ref}$, with the consequence that the delay of each delay cell is controlled to be equal to ⅙ of the period of the reference frequency. It may be clear that another number of inverters per cell and/or another number of cells in the oscillatory circuit will give another ratio between the delay per cell and the period of the reference frequency.

Because the shortest pulse-width in the waveform originating from the asynchronous $\Sigma\Delta$ modulator is $T_c/4$, the slope, generated in the first inverter $I_7$ of the delay cell, should not be longer than $T_c/4$. Furthermore, because the inverters $I_8 \ldots I_{11}$ of the cell generate a new sharp edge when the slope is about halfway between the positive and negative supply voltages, the delay per cell cannot be larger than $T_c/8$. This is less than the delay per cell ($T_c/4$) in the arrangement of FIG. 1 and the delay per cell ($T_c$) in the arrangement of FIG. 4. On the other hand, the simpler construction of the delay cell of FIG. 6 makes it possible to have more cells per $mm^2$ chip area.

What is claimed is:

1. Analog FIR-filter comprising an analog delay-line characterized by an asynchronous $\Sigma\Delta$ modulator receiving an analog input signal and generating amplitude-discrete time-continuous pulses, a delay-line receiving said amplitude-discrete time-continuous pulses and comprising a sequence of delay cells for generating delayed amplitude-discrete time-continuous pulses at one or more outputs of the delay-line, and means connected to said one or more outputs for combining the delayed amplitude-discrete time-continuous pulses to generate a filtered version of the analog input signal, of the delay cells comprises means for generating a one-shot pulse with a leading edge and a trailing edge, wherein the leading edge of a pulse in a cell in the sequence is started by the trailing edge of the one-shot pulse generated in a previous cell in the sequence.

2. Analog FIR-filter as claimed in claim 1 characterized by said delay cells comprising a low-current inverter receiving the amplitude-discrete time-continuous pulses to be delayed and generating pulses with relatively low-steep slopes and one or more high-current inverters receiving said low-steep slope pulses and generating delayed amplitude-discrete time-continuous pulses with relatively high-steep edges.

3. Analog FIR-filter as claimed in claim 2 further comprising;
one or more dummy delay-cells which are matched to the cells of the sequence of delay cells and which are arranged in a feedback arrangement to constitute an oscillatory circuit, for comparing the pulses generated by the oscillatory circuit with a reference frequency, and means for applying the result of the comparison to the dummy delay cells and to the delay cells of the sequence of delay cells to control the delay thereof.

4. Analog FIR-filter as claimed in claim 1, characterized in that each of the delay cells comprises means for generating spikes at the trailing edge of said one-shot pulse and means to apply said spikes to the next cell in the sequence of cells and/or to a latch for generating delayed amplitude-discrete time-continuous pulses.

5. Analog FIR-filter as claimed in claim 1 further comprising; a dummy one-shot pulse generator that is matched to the one-shot pulse generating means of the sequence of delay cells, by means to initialize the dummy one-shot pulse generator with a fixed duty-cycle reference frequency, for comparing the one-shot pulse of the dummy one-shot pulse generator with the reference frequency, and for applying the result of the comparison to the dummy one-shot pulse generator and to the one-shot pulse generating means of the sequence of delay cells, to control the pulse-width thereof.

6. Analog FIR-filter as claimed in claim 1 characterized by two delay-lines, one for delaying the leading edges of the amplitude-discrete time-continuous pulses generated by the asynchronous ΣΔ modulator and one for delaying trailing edges of the amplitude-discrete time-continuous pulses generated by the ΣΔ modulator and latch means for combining the output signals of the two delay-lines to generate delayed amplitude-discrete time-continuous pulses.

7. The analog FIR-filter as claimed in claim 1 further comprising;
one or more dummy delay cells matched to the cells of the sequence of delay cells and which are connected in a feedback circuit,
means for comparing pulses generated by the feedback circuit to a reference frequency to derive a control signal, and
means for applying the control signal to the dummy delay cells and to the delay cells of the sequence of delay cells so as to control the delay thereof.

8. The analog FIR-filter as claimed in claim 1 further comprising;
a second delay line coupled and parallel with the first delay line to an output of the asynchronous ΣΔ modulator, wherein
the first delay line delays leading edges of the amplitude-discrete time-continuous pulses generated by the asynchronous ΣΔ modulator and the second delay line delays trailing edges of the amplitude-discrete time-continuous pulses generated by the ΣΔ modulator, and
latch means for combining output signals of the first and second delay lines to generate delayed amplitude-discrete time-continuous pulses.

9. An analog FIR-filter with an analog delay line comprising;
an input terminal for receipt of an analog input signal,
an asynchronous ΣΔ modulator for receiving the analog input signal from the input terminal and for generating amplitude-discrete time-continuous pulses,
a delay line comprising a sequence of delay cells and one or more outputs of the delay cells of the delay line,
means for coupling said delay line to an output of the asynchronous ΣΔ modulator for receiving said amplitude-discrete time-continuous pulses and for generating delayed amplitude-discrete time-continuous pulses at the one or more outputs of the delay line, and
means coupled to said one or more outputs for combining the delayed amplitude-discrete time-continuous pulses so as to generate a filtered version of the analog input signal,
wherein at least one cell of the delay line comprises means for generating a sequence of unipolar pulses each having a leading edge and and a trailing edge corresponding to respective leading and trailing edges of the amplitude-discrete time-continuous pulses received from the asynchronous ΣΔ modulator.

10. Analog FIR-filter as claimed in claim 9 wherein the coupling means comprises a differentiator and a rectifier circuit coupled in series between the output of the asynchronous ΣΔ modulator and an input of the delay line.

11. The analog FIR-filter as claimed in claim 9 wherein at least one cell of the delay line comprises;
means for generating a sequence of pulses each having a leading edge and a trailing edge corresponding to respective leading and trailing edges of the amplitude-discrete time-continuous pulses received from the asynchronous ΣΔ modulator, and
a differentiator and a halfwave rectifier coupled in series with said generating means.

12. The analog FIR-filter as claimed in claim 9 wherein said combining means comprises current weighting means and switching means coupled to at least one of the outputs of the delay line.

13. The analog FIR-filter as claimed in claim 9 wherein at least one cell of the delay line comprises means for generating a sequence of pulses related to the amplitude-discrete time-continuous pulses received from the asynchronous ΣΔ modulator, and said amplitude-discrete time-continuous pulses of the asynchronous ΣΔ modulator have a center frequency, and the width of the pulses of the generated sequence of pulses is at most ¼ of the period of said center frequency.

* * * * *